United States Patent
Nishikunibaru et al.

(10) Patent No.: US 10,850,232 B2
(45) Date of Patent: Dec. 1, 2020

(54) DRY ROOM FOR GAS SUBSTITUTION

(71) Applicant: SEIBU GIKEN CO., LTD., Fukuoka (JP)

(72) Inventors: Hitomi Nishikunibaru, Fukuoka (JP); Kazuhiko Kawaguchi, Fukuoka (JP); Hiroaki Ejima, Fukuoka (JP); Mayu Iwasaki, Fukuoka (JP)

(73) Assignee: SEIBU GIKEN CO., LTD., Fukuoka (JP)

( * ) Notice: Subject to any disclaimer, the term of this patent is extended or adjusted under 35 U.S.C. 154(b) by 329 days.

(21) Appl. No.: 16/123,562

(22) Filed: Sep. 6, 2018

(65) Prior Publication Data

US 2019/0076782 A1 Mar. 14, 2019

(30) Foreign Application Priority Data

Sep. 14, 2017 (JP) .................................. 2017-176261
Jul. 12, 2018 (JP) .................................. 2018-132005

(51) Int. Cl.
*B01D 53/86* (2006.01)
*B01D 53/75* (2006.01)
(Continued)

(52) U.S. Cl.
CPC ......... *B01D 53/75* (2013.01); *B01D 46/0036* (2013.01); *B01D 53/06* (2013.01); *B01D 53/261* (2013.01); *B01D 53/8671* (2013.01); *H01L 21/67017* (2013.01); *H01L 21/67034* (2013.01); *H01L 51/0029* (2013.01);
(Continued)

(58) Field of Classification Search
CPC .............. B01D 2256/10; B01D 53/261; B01D 2259/4508; B01D 46/0036; B01D 2257/104; B01D 53/8671; B01D 53/06; B01D 2279/51; B01D 53/75;
(Continued)

(56) References Cited

U.S. PATENT DOCUMENTS 5,221,520 A * 6/1993 Cornwell .................. A61L 9/16
422/122
6,733,570 B2 * 5/2004 Fujii ...................... B01D 46/12
55/385.2
(Continued)

FOREIGN PATENT DOCUMENTS

JP 2015-510254 4/2015

*Primary Examiner* — Timothy C Vanoy
(74) *Attorney, Agent, or Firm* — Staas & Halsey LLP

(57) ABSTRACT

A dry room for gas substitution has a drying chamber to receive dry air from a dry air supply device. Gas is circulated between inside the drying chamber and the dry air supply device. An airtight container is accommodated in the drying chamber. A low dew point gas supply device coupled to the airtight container removes moisture and supplies low dew point gas to the airtight container via a filter that removes foreign matter. An inert gas purification device removes oxygen and supplies an inert gas to the airtight container. A gas exhaust passage exhausts gas in the airtight container to outside of the drying chamber. The low dew point gas supply device and the inert gas purification device are independently provided so that moisture removal via the low dew point gas supply device is adjusted independently of oxygen removal via the inert gas purification device.

17 Claims, 1 Drawing Sheet

(51) Int. Cl.
*B01D 53/26* (2006.01)
*B01D 53/06* (2006.01)
*B01D 46/00* (2006.01)
*H01L 21/67* (2006.01)
*H01L 51/00* (2006.01)

(52) U.S. Cl.
CPC ............... *B01D 2255/1021* (2013.01); *B01D 2255/20761* (2013.01); *B01D 2256/10* (2013.01); *B01D 2257/104* (2013.01); *B01D 2257/80* (2013.01); *B01D 2259/4508* (2013.01); *B01D 2279/51* (2013.01)

(58) Field of Classification Search
CPC .......... B01D 2257/80; H01L 21/67017; H01L 51/0029; H01L 21/67034
See application file for complete search history.

(56) References Cited

U.S. PATENT DOCUMENTS

| | | | |
|---|---|---|---|
| 6,881,268 B2* | 4/2005 | Shinoda | C23C 16/405 118/50 |
| 10,245,554 B2* | 4/2019 | Srivastava | C01B 23/0026 |
| 2003/0177912 A1* | 9/2003 | McGuire | B67D 1/06 99/323 |
| 2005/0178267 A1* | 8/2005 | Fujii | B01D 53/26 95/90 |

* cited by examiner

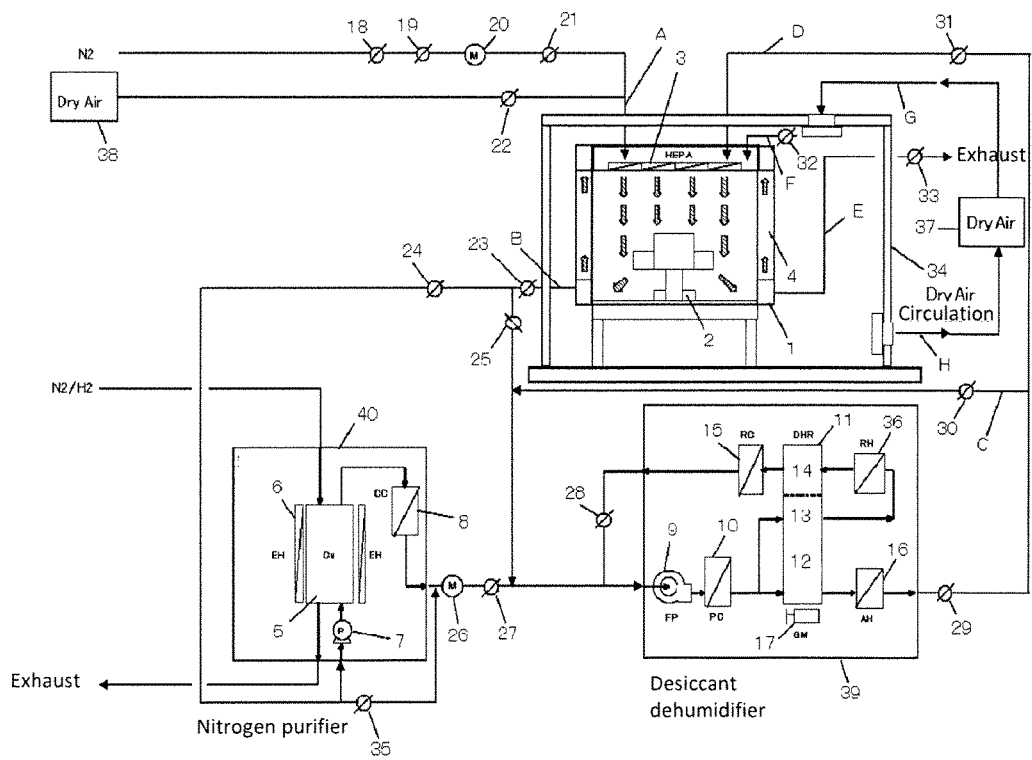

DRY ROOM FOR GAS SUBSTITUTION

CROSS-REFERENCE TO RELATED APPLICATIONS

This application is based on and hereby claims priority to Japanese Patent Application 2018-132005 filed on Jul. 12, 2018 and Japanese Patent Application 2017-176261 filed on Sep. 14, 2017, the contents of which are hereby incorporated by reference.

BACKGROUND

The present invention relates to a gas substitution system. According to one potential embodiment, the system includes a dehumidifier system and a gas purification machine and in which a maintenance, an adjustment, etc. for manufacture device can be performed in a short time under environment of the low dew point (hereinafter referred to as "concentration of active gas close to 0 ppm as"low active gas concentration") in a drying room or a chamber in a state of low activated gas concentration (hereinafter referred to as "low dew point") such as a booth in which an organic electroluminescence display manufacture device is installed.

Conventionally, the organic EL element has been used for an organic EL display device or the like which is expected as a next generation flat panel display instead of a liquid crystal display device. This organic EL element is expected to be promising for use as a solid light emitting type inexpensive large area full color display element or writing light source array, and active research and development is under way. However, organic substances, such as an organic luminescent material used for an organic EL device, an electrode, etc. are weak for moisture, and the performance and its characteristic deteriorate rapidly with moisture in the air.

At the present time, in the manufacture of organic EL displays (OLED), by using a printing technique such as inkjet technology, the liquid organic EL material is made into a uniform thin film on the substrate, thereby improving production efficiency and performance. Techniques for making elements are being developed. In order to develop such a manufacturing technique, it is necessary to set the environment of the manufacture device to a state of low humidity and low active gas concentration of 1 ppm or less of moisture and 1 ppm or less of oxygen. However, when maintaining or adjusting the manufacture device within the booth, it is necessary to return the low-humidity nitrogen environment to the atmospheric environment (hereinafter referred to as "atmospheric break").

At this time, when replacing the nitrogen environment with normal atmosphere, various parts of the apparatus inside the environment adsorb moisture. Therefore, when returning to the nitrogen environment, it takes very long time to desorb the moisture adsorbed by the parts.

Patent Document 1, Japanese Patent Publication No. 2015-510254, discloses a technique for minimizing the volume of the inert gas enclosure assembly in order to minimize the amount of inert gas for returning to the nitrogen environment from this atmospheric environment with atmospheric break and to minimize the downtime.

SUMMARY

In the technique disclosed in Patent Document 1, Japanese Patent Publication No. 2015-510254, it is possible to minimize the amount of inert gas in the gas enclosure by minimizing the inactivation time by maintenance or the like by framing the gas enclosure and making the internal volume as small as possible. At the same time, the work space can be optimized to accommodate the footprint of various OLED manufacture device. However, during pause, purification of the accompanying inert gas is stopped and the gas purification system for simultaneous moisture removal is also stopped. Therefore, as a problem again, the time to make the inside of the booth low in low humidity and low outgas concentration environment is too long. Further, as other problem, since the gas refining device and the dehumidifying device are in the same mechanism and the purification rate is different between oxygen and moisture, it takes time to remove moisture as compared with the removal of oxygen. Therefore, it is difficult to remove oxygen and moisture at the same time.

In order to solve the above problems, the inventors propose an airtight container in a drying chamber, a low active gas and a low dew point gas are supplied to the airtight container, and further the proposal comprises an inert gas refining device and a low dew point gas supply device can be controlled independently of each other. With this configuration, when a person enters inside the airtight container for adjustment or the like, it is possible to greatly shorten the pause time due to the atmospheric break by stopping the supply of the low active gas while maintaining the supply of the low dew point air. In other words, since water molecules are polar substances, if water is introduced into an airtight container that needs to be kept at a low dew point, water molecules adhere to the wall surface of the airtight container and inside the filter. In order to discharge this adhered water molecule, it is necessary to supply low dew point air for a long time. However, in the case of this embodiment, the supply of the low dew point gas can be maintained in a state where the supply of the low active gas is stopped, and even after the atmospheric break, the dew point in the airtight container can reach a low state. Also, these gases are expensive even if they are nitrogen gas contained in a cylinder as low active gas or air from which oxygen has been removed. Therefore, cost will be increased unless time for atmospheric break is shortened. Meanwhile, if the low dew point gas is manufactured with the desiccant rotor, the cost can be reduced. Therefore, maintenance and the like are performed in a state where the supply of the low active gas is stopped while maintaining the supply of the low dew point gas. This makes it possible to lower the total cost.

Also, since each device for removing moisture and oxygen is normally in the same apparatus, the flow rate of the gas flowing through the moisture removing device and the oxygen removing device is the same. However, by using these as separate devices, the flow rate of each device can be freely changed. This makes it possible to manufacture a dry room with a low active gas concentration under optimal operating conditions that simultaneously realize both low humidity and low active gas concentration.

Since the proposed dry room for gas replacement is constructed as described above, it is possible to supply low dew point air to one way (hereinafter referred to as "one pass") without circulating it from the air purification filter such as the HEPA filter or the ULPA filter installed in the upper part of the container even during the atmospheric break. Therefore, in the dry room, a filter which is most likely to retain moisture is prevented from retaining moisture, whereby, maintenance, changeover etc. can be carried out. In addition, by installing inert gas refining device and desiccant dehumidifier in series in the circulation path of the container, separately providing a circulation path separated from the circulation path, and circulating in a separately provided circulation path during atmospheric break, the circulating air does not come close to the atmospheric environment. With this configuration, it is possible to drastically shorten the recovery time for returning from the atmospheric environment after the atmospheric break of the container to the environment of low active gas concentration at low humidity. Furthermore, by individually controlling the flow rates of the gases flowing through the dehumidifier and the inert gas purifier, it is possible to provide a dry room that can be easily optimized in an environment with low humidity and low active gas concentration in a short time.

BRIEF DESCRIPTION OF THE DRAWINGS

These and/or other aspects and advantages will become apparent and more readily appreciated from the following description of the embodiments, taken in conjunction with the accompanying drawing of which:

FIG. 1 is a flow FIGURE for a first preferred embodiment of the proposed dry room for gas substitution.

DETAILED DESCRIPTION OF THE PREFERRED EMBODIMENTS

Reference will now be made in detail to the embodiments, examples of which are illustrated in the accompanying drawing, wherein like reference numerals refer to the like elements throughout. The embodiments are described below to explain the present invention by referring to the FIGURE.

The mode for carrying of the inventors' proposals is explained using drawings as below. In the present embodiment, about a gas substitution dehumidifier and a gas substitution method for a container which needs to keep the interior at a low dew point and a low active gas concentration, a container of a manufacture device or a research and development device for an organic EL display (OLED) utilizing a printing technique such as an inkjet technique is explained as an example. It is to be noted that the proposals are not limited to the manufacture device and the development device for organic EL display (OLED), and the proposals are applicable for a storage container or a closed space such as a glove box used for development of lithium ion battery materials and semiconductor fields that need to keep the inside of the storage space clean at a low dew point and a low active gas concentration.

A first preferred embodiment of the dry room for gas substitution is described in detail along with FIG. 1 as follows. Reference numeral 1 denotes an airtight container which needs to keep the inside clean at low dew point and low active gas concentration. This container could accommodate a manufacture device 2 used, for example, for manufacturing an organic EL display (OLED) and for research and development, and has therein a gas circulation path 4 and an air purification filter 3 such as a HEPA filter and a ULPA filtering. The air purification filter 3 may be a plurality of fan filter units. Nitrogen gas and dry air from a dehumidifier 38 are supplied to the container 1 by a pipe A.

The air to be processed in the container 1 passes through a pipe B and is sent to a nitrogen purifier 40 as an inert gas purification device to remove oxygen as an active gas in the air to be processed. Reference numeral 5 denotes a catalyst container for purifying nitrogen which accommodates a copper catalyst, a platinum catalyst, and the like. When this catalyst breaks, the temperature is raised by a heater 6 while regenerating these catalysts while nitrogen gas and hydrogen gas are flowing. Reference numeral 7 denotes a pump for feeding the air to be processed to the nitrogen purifier 40. The refined processed air passes through a cooler 8 and is sent to a desiccant dehumidifier 39 as a low dew point gas supply device by a blower 9. In this embodiment, a catalyst such as a copper catalyst or a platinum catalyst is used. However, the proposals are not limited thereto, and other catalysts containing copper and/or platinum as a main component may be used.

Reference numeral 11 denotes a honeycomb rotor for the desiccant dehumidifier 39, which is divided into a processing zone 12, a purge zone 13, and a regeneration zone 14. Reference numeral 17 denotes a rotor drive motor such as a geared motor for rotatingly driving the honeycomb rotor. In the processing zone 12, the air to be processed is supplied by the blower 9 through the pre-cooler 10. A part of the air to be processed is branched in front of the processing zone 12, passes through the purge zone 13, and is sent to the regeneration zone 14 through the regeneration heater 36. In this embodiment, the honeycomb rotor 11 having the purge zone 13 is used. However, the proposals are not limited thereto, and a honeycomb rotor divided into two zones may be used for the processing zone and the regeneration zone.

The air leaving the regeneration zone 14 is cooled by the cooler 15, and water condensed from the moisture in the regeneration air desorbed from the honeycomb rotor is removed as a drain and returned to the front of the blower 9. The air to be processed that has left the desiccant dehumidifier 39 is warmed by the after-heater 16 as necessary, and returned to the container 1 through the pipe D. In this embodiment, in the case where there is a margin for the nitrogen gas supply facility, by installing the desiccant dehumidifier 39 in a hermetically sealed room and supplying nitrogen gas to the room, it may be configured to suppress entry of active gas from the desiccant dehumidification 39.

Reference numeral 34 denotes an airtight drying chamber for accommodating the container 1, and has a size that a person can enter in the case of adjustment or the like. Dry air from the dry air supply device 37 is supplied to the container through a pipe G, and the air in the drying chamber 34 is returned to the dry air supply device 37 through a pipe H. The pipe E is an exhaust path for exhausting the air in the container 1 to the outside of the drying chamber 34. A honeycomb rotor similar to the honeycomb rotor 11 having the purge zone 13 may be used for the dry air supply device 37. However, the proposals are not limited thereto.

Regarding the operation of the dry room for gas substitution having the above-described configuration, first, nitrogen replacement and circulation operation of the container 1 will be described. By opening the valves 18, 19, 21, 22, 23, 24, 25, 27, 28, 29, 30, 31, 33 and 35, nitrogen gas and dry air are sent from the pipe A to the container 1. In FIG. 1, reference numerals 20 and 26 represent flow meters. When the oxygen concentration in the container 1 drops to 100 ppm or less, the valves 30, 33 and 35 are closed. Next, in order to supply dry air of a low dew point from the nitrogen purifier 40 and the desiccant dehumidifier 39 and from the pipe G to the drying chamber 34, the operation of the dry air supply device 37 for circulating dry air is started. If necessary, by regulating the valves 24 and 25, the air volume flowing from the container 1 through the pipe B to the nitrogen purifier 40 and the air volume directed directly to the desiccant dehumidifier 39 are adjusted. For example, the circulation is continued until the concentration reaches a prescribed concentration such as an oxygen concentration of 1 ppm or less, a water concentration of 1 ppm or less, and then the operation of the manufacture device 2 is started.

After that, a testing for the manufacture of OLED and research and development is started.

In the first embodiment, nitrogen is supplied from the pipe A to the container 1. However, the present proposals are not limited to this. Nitrogen may be supplied from the inlet of the nitrogen purifier 40, it may be supplied from between the nitrogen purifier 40 and the desiccant dehumidifier 39.

Next, an atmospheric break for carrying out maintenance, setup change, adjustment, and the like of the container 1 will be described. By closing the valves 18, 19, 21, 23 and 31 and opening the valves 30, 32 and 33, the container 1 and the nitrogen circulation line from the pipe B to the pipe D are isolated. The nitrogen is replaced with air by opening the seal of the container 1 and placing dry air through the pipe A from the top of the container 1. Also, the valve 32 of the pipe F is opened so that the low dew point dry air supplied from the dry air supply device 37 via the pipe G is supplied from the upper part of the container 1 in one pass. As a result, a large amount of air can be safely supplied at once, so that the replacement speed of nitrogen and air can be drastically shortened. In addition, dry air is supplied in one pass from the upper part of the air purification filter 3 which is most likely to keep the moisture in the container 1 without circulating inside the container 1. As a result, even if a person works internally, moisture is not left inside the container 1 but is discharged to the outside. It should be noted that the piping F and the piping G may be connected and the dry air of low dew point to be supplied to the drying chamber 34 by valve operation or the like may be supplied directly from the upper portion of the container 1 directly.

In the nitrogen circulation line, since air passes through the pipe C as a circulation path by opening the valve 30, dried air with high nitrogen concentration and low humidity circulates. When regenerating the catalyst in the catalyst container 5 of the nitrogen purifier 40, the valve 35 is opened to bypass the nitrogen purifier 40 and air is sent to the desiccant dehumidifier 39 for circulation. By operating the valve by dividing the dehumidifying device and the oxygen removing device in this manner, it is possible to adjust the optimum operating environment by changing the flow rate of gas flowing in each device and the number of circulation. It is noted that the valve is not limited to this, and an air volume regulator such as a damper or VAV (a variable air volume) may be used.

In the first embodiment, a single nitrogen purifier 40 is used. However, two or more of the plurality of nitrogen purifiers may be installed in parallel. While one catalyst of the nitrogen purifier is regenerated, the nitrogen purification processing may be performed by other nitrogen purifier.

Further, a mechanism having a nitrogen purification function may be mounted inside the desiccant dehumidifier 39, and the nitrogen purifier 40 may be eliminated as an integrated type apparatus. In this case, the humidity and the inert gas concentration in the container 1 can be individually adjusted by providing a circulation path, a bypass path and the like. This makes it possible to create an environment with low dew point at low active gas concentration. With such a configuration, it is possible to provide a gas replacement system that is smaller in space than the first embodiment, and it is possible to suppress the initial cost involved in piping and installation work.

In this way, by covering the airtight container 1 that needs to keep the interior at low dew point and low active gas concentration clean by the drying chamber 34 that supplies dry air of low dew point, moisture penetration from the outside can be minimized. Further, unlike the related art in which oxygen removal and moisture removal are performed by a single gas purification system as in Patent Document 1, in this embodiment, oxygen removal is performed by a nitrogen purifier 40. On the other hand, moisture removal is performed using a desiccant dehumidifier 39 separately. Since such removal makes it possible to arbitrarily adjust the oxygen removing performance and the moisture removing performance, it is easy to optimize the apparatus and manage the apparatus.

With the above configuration, it is possible to shorten the return time from the atmospheric environment of the container 1 after the atmospheric break to return the inside to a clean environment with a low dew point and a low active gas concentration to $\frac{1}{5}$ to $\frac{1}{10}$ of that of the conventional technique. Further, it is possible to realize a gas replacement system which can easily optimize the interior of the container 1 to a low humidity and a low active gas concentration.

The proposals can also be used for a storage container such as a glove box used for developing a lithium ion battery material or the like which needs to keep the interior of the storage space clean in a state of low dew point and low active gas concentration.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A dry room for gas substitution, comprising:
    a dry air supply device;
    a drying chamber to receive dry air from the dry air supply device;
    an airtight container accommodated in said drying chamber;
    a filter that removes foreign matter;
    a low dew point gas supply device coupled to the airtight container, to remove moisture and supply low dew point gas to the airtight container via the filter that removes foreign matter;
    an inert gas purification device coupled to the airtight chamber to remove oxygen and supply an inert gas to the airtight container;
    a gas exhaust passage coupled to the airtight container to exhaust gas in said airtight container to outside of said drying chamber; and
    a pipeline to circulate gas between inside the drying chamber and the dry air supply device, wherein
    the low dew point gas supply device and the inert gas purification device are independently provided so that moisture removal via the low dew point gas supply device is adjusted independently of oxygen removal via the inert gas purification device.

2. A dry room for gas substitution according to claim 1, further comprising:
    an air flow rate adjusting device for isolating the airtight container and the inert gas purification device from one another; and
    a circulation path to circulate gas through the inert gas purification device when the inert gas purification device is isolated from the airtight container.

3. A dry room for gas substitution according to claim 1, wherein said filter that removes foreign matter is a fan filter incorporating at least one of a high-efficiency particulate air (HEPA) filter and an ultra-low particulate air (ULPA) filter.

4. A dry room for gas substitution according to claim 1, wherein
said inert gas purification device is a nitrogen refining device incorporating a catalyst containing at least one of copper and platinum as a main component.

5. A dry room for gas substitution according to claim 1, wherein
said low dew point gas supply device is a desiccant dehumidifier.

6. A dry room for gas substitution according to claim 2, wherein
said filter that removes foreign matter is a fan filter incorporating at least one of a high-efficiency particulate aft (HEPA) filter and an ultra-low particulate air (ULPA) filter.

7. A dry room for gas substitution according to claim 6, wherein
said inert gas purification device is a nitrogen refining device incorporating a catalyst containing at least one of copper and platinum as a main component.

8. A dry room for gas substitution according to claim 7, wherein
said low dew point gas supply device is a desiccant dehumidifier.

9. A dry room for gas substitution according to claim 1, wherein
said low dew point gas supply device comprises a honeycomb rotor.

10. A dry room for gas substitution according to claim 1, wherein
the low dew point gas supply device and the inert gas purification device are coupled to the airtight container via one another such that a combined low dew point inert gas is supplied to the airtight container via the filter that removes foreign matter.

11. A method comprising:
providing the dry room for gas substitution according to claim 1; and
adjusting moisture removal via the low dew point gas supply device independently of adjusting oxygen removal via the inert gas purification device.

12. The method according to claim 11, further comprising preparing the airtight container to allow for human interaction, by a process comprising:
disconnecting the inert gas purification device from the airtight container;
opening the gas exhaust passage to externally exhaust gas from inside the airtight container; and
providing dry air to inside the airtight container while the inert gas purification device is disconnected from the airtight container.

13. The method according to claim 12, wherein
preparing the airtight container to allow for human interaction further comprises circulating dry air through the drying chamber while the inert gas purification device is disconnected from the airtight container.

14. The method according to claim 12, wherein
preparing the airtight container to allow for human interaction further comprises maintaining dry air in the drying chamber while the inert gas purification device is disconnected from the airtight container.

15. The method according to claim 12, wherein
in preparing the airtight container to allow for human interaction, providing dry air to inside the airtight container comprises supplying dry air to the airtight container from the drying chamber.

16. The method according to claim 12, wherein in preparing the airtight container to allow for human interaction, disconnecting the inert gas purification device from the airtight container comprises:
isolating the inert gas purification device from the airtight container; and
circulating gas through the inert gas purification device.

17. The method according to claim 12, wherein
in preparing the airtight container to allow for human interaction, gas is circulated through both the inert gas purification device and the low dew point gas supply device while the inert gas purification device is disconnected from the airtight container.

* * * * *

UNITED STATES PATENT AND TRADEMARK OFFICE
CERTIFICATE OF CORRECTION

PATENT NO.         : 10,850,232 B2
APPLICATION NO.    : 16/123562
DATED              : December 1, 2020
INVENTOR(S)        : Hitomi Nishikunibaru et al.

It is certified that error appears in the above-identified patent and that said Letters Patent is hereby corrected as shown below:

In the Claims

Column 7, Line 18, In Claim 6, delete "aft" and insert -- air --, therefor.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*